United States Patent
Yun

(10) Patent No.: US 12,339,547 B2
(45) Date of Patent: Jun. 24, 2025

(54) DISPLAY APPARATUS

(71) Applicant: LG Display Co., Ltd., Seoul (KR)

(72) Inventor: YeongHo Yun, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 170 days.

(21) Appl. No.: 18/186,694

(22) Filed: Mar. 20, 2023

(65) Prior Publication Data

US 2023/0305345 A1  Sep. 28, 2023

(30) Foreign Application Priority Data

Mar. 22, 2022 (KR) .................. 10-2022-0035241

(51) Int. Cl.
  *G02F 1/1362* (2006.01)
(52) U.S. Cl.
  CPC .. *G02F 1/136204* (2013.01); *G02F 1/136209* (2013.01); *G02F 1/136259* (2013.01)
(58) Field of Classification Search
  CPC . H01L 23/60; G02F 2202/22; G02F 1/136204
  See application file for complete search history.

(56) References Cited

U.S. PATENT DOCUMENTS

| 2021/0134931 A1 | 5/2021 | Kim et al. |
| 2023/0046867 A1* | 2/2023 | Wang ............ H10K 59/88 |

FOREIGN PATENT DOCUMENTS

| CN | 112614427 A |  | 4/2021 | |
| CN | 113889013 A | * | 1/2022 | ............ G09G 3/006 |
| KR | 20210053610 A |  | 5/2021 | |
| KR | 2021081953 A | * | 7/2021 | |
| KR | 2021086029 A | * | 7/2021 | ............ G09F 9/301 |

* cited by examiner

*Primary Examiner* — Alexander P Gross
(74) *Attorney, Agent, or Firm* — Seed IP Law Group LLP

(57) ABSTRACT

A display apparatus includes a display panel including a substrate, a pixel array part, and an encapsulation part, a cover member disposed on the display panel, an optical plate which is disposed between the display panel and the cover member and has a first hole, a crack detecting part disposed on the encapsulation part, and an antistatic member which is disposed below the cover member and in the first hole.

21 Claims, 7 Drawing Sheets

DISPLAY APPARATUS

CROSS-REFERENCE TO RELATED APPLICATIONS

This application claims the priority of Korean Patent Application No. 10-2022-0035241 filed on Mar. 22, 2022, in the Korean Intellectual Property Office, the disclosure of which is incorporated herein by reference.

BACKGROUND

Technical Field

The present disclosure relates to a display apparatus, and more particularly, to a display apparatus which may improve a phenomenon in which a partial area of an end portion of a display panel emits light brighter than the other area or a greenish phenomenon in which a partial area of an end portion of the display panel emits green light.

Description of the Related Art

Various types and forms of display apparatus which display images in TVs, monitors, smart phones, tablet PCs, and notebooks are being used.

Among various types of display apparatus, a liquid crystal display (LCD) device has been used up to now and a usage and an applicable range of an organic light emitting display (OLED) device are also rapidly expanding.

Display devices include a plurality of light emitting diodes or liquid crystals for implementing images, and display panels having driving transistors to individually control each operation of light emitting diodes or liquid crystals to allow the plurality of light emitting diodes or liquid crystals to display images to be displayed.

Among them, the liquid crystal display device is not a self-emitting device so that a light source such as a backlight which supplies light from a rear surface is required. The backlight increases a thickness of the liquid crystal display device, and has a restriction to implement a display apparatus which is bendable or has various types of designs.

The organic light emitting display apparatus having a self-emitting diode may be implemented to be thinner than a display apparatus with a light source therein, and does not require a separate light source so that a display apparatus which is bendable or has various designs may be implemented.

In order to drive a light emitting diode of such an organic light emitting display apparatus, a driving circuit configured by a plurality of transistors and a capacitor is formed in the display apparatus, and a voltage is applied to a driving circuit to be driven.

BRIEF SUMMARY

The display panel is configured to include the plurality of transistors and capacitors so that when charges generated at the outside of the display apparatus flow into the display panel, the display panel may abnormally operate.

For example, the display apparatus may include a cover member formed of glass or a plastic material to protect the display panel from an external impact. However, charges generated due to the friction between the cover member and the external material or charges generated at the outside are accumulated in the cover member, and the accumulated charges move to the display panel, or may generate a strong electric field at the end portion or a side surface of the display panel.

A threshold voltage of the driving thin film transistor disposed on the side surface of the display panel may be shifted due to the charges or the electric field. When the threshold voltage of the driving thin film transistor increases, the display panel may emit light by a higher voltage than that of the related art. Accordingly, an edge portion or a side area of the display panel may emit light brighter than that of the other area, or a green pixel which occupies a large area emits brighter light to cause the greenish phenomenon, resulting in degradation of a display quality.

Further, when the threshold voltage decreases due to a shift of the threshold voltage, a threshold voltage of a driving thin film transistor disposed on a side surface of the display panel is lowered, and the display panel may emit light at a signal lower than an emission signal. Accordingly, an edge portion or a side surface area of the display panel may emit light regardless of the application of the emission signal to emit brighter light than the other area, or cause greenish phenomenon so that the display quality may be degraded.

One or more embodiments of the present disclosure provide a display apparatus which may reduce a phenomenon in which an edge portion of the display panel emits brighter light or a greenish phenomenon.

Technical benefits of the present disclosure are not limited to the above-mentioned benefits, and other benefits, which are not mentioned above, can be clearly understood by those skilled in the art from the following descriptions.

According to an aspect of the present disclosure, the display apparatus may include: a display panel including a substrate, a pixel array part, and an encapsulation part, and displaying an image; a cover member which is disposed on the display panel, and protects the display panel from external impact; an optical plate which is disposed between the display panel and the cover member, and has a first hole; a crack detecting part which is disposed on the encapsulation part to detect a crack generated in the display panel; and an antistatic member which is disposed below the cover member and in the first hole, and is in contact with the crack detecting part.

According to another aspect of the present disclosure, the display apparatus may include: a display panel including a substrate, a pixel array part, and an encapsulation part, and displaying an image; a cover member which is disposed on the display panel, and protects the display panel from external impact; an optical plate disposed between the display panel and the cover member; a first plate which is disposed below the display panel, and supports the display panel; a crack detecting part which is disposed on the encapsulation part to detect a crack generated in the display panel; and an antistatic member which is disposed on a side surface of the optical plate, and is in contact with the crack detecting part.

Other detailed matters of the exemplary embodiments are included in the detailed description and the drawings.

According to an exemplary embodiment of the present disclosure, a crack detecting part is connected to a driver which has a ground pattern or is connected to a ground part to ground charges, or an electric field generated on the side surface of the cover member and the display panel. Accordingly, a phenomenon in which an edge portion of the display panel emits brighter light, or a greenish phenomenon may be reduced.

According to an exemplary embodiment of the present disclosure, an antistatic member is in contact with a heat dissipating layer disposed below the display panel so that charges or the electric field generated in the cover member and the display panel are distributed to the heat dissipating layer to be removed.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
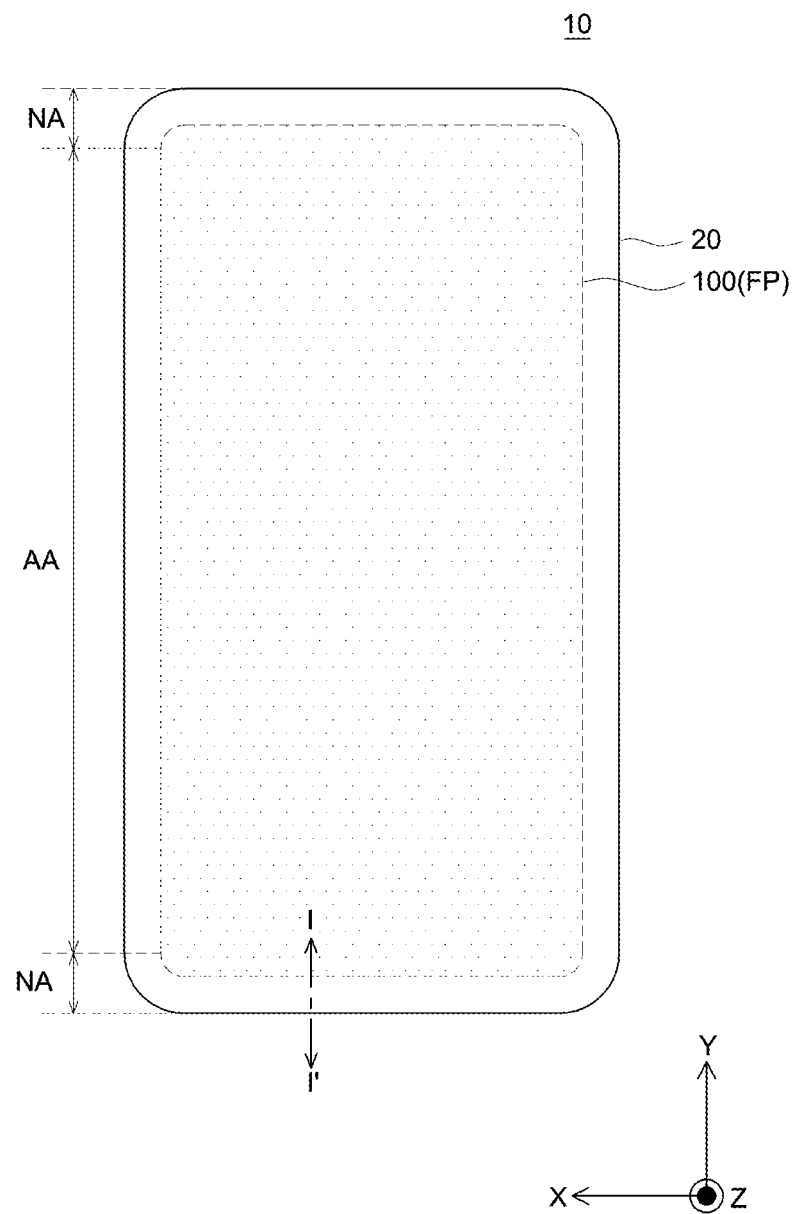
FIG. 1A is a plan view of a front surface of a display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, dimensions (e.g., length, width, height, thickness, radius, diameter, area, etc.), ratios, angles, number of elements, and the like illustrated in the accompanying drawings for describing the exemplary embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated. However, it is to be noted that the relative dimensions including the relative size, location, and thickness of the components illustrated in various drawings submitted herewith are part of the present disclosure.

Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

The display apparatus of the present specification may be applied to an organic light emitting display apparatus, but is not limited thereto, and may be applied to various display apparatuses such as an LED display apparatus or a quantum dot display apparatus.

Hereinafter, a display apparatus according to an exemplary embodiment of the present disclosure will be described with reference to the drawings.

Figure 1B:
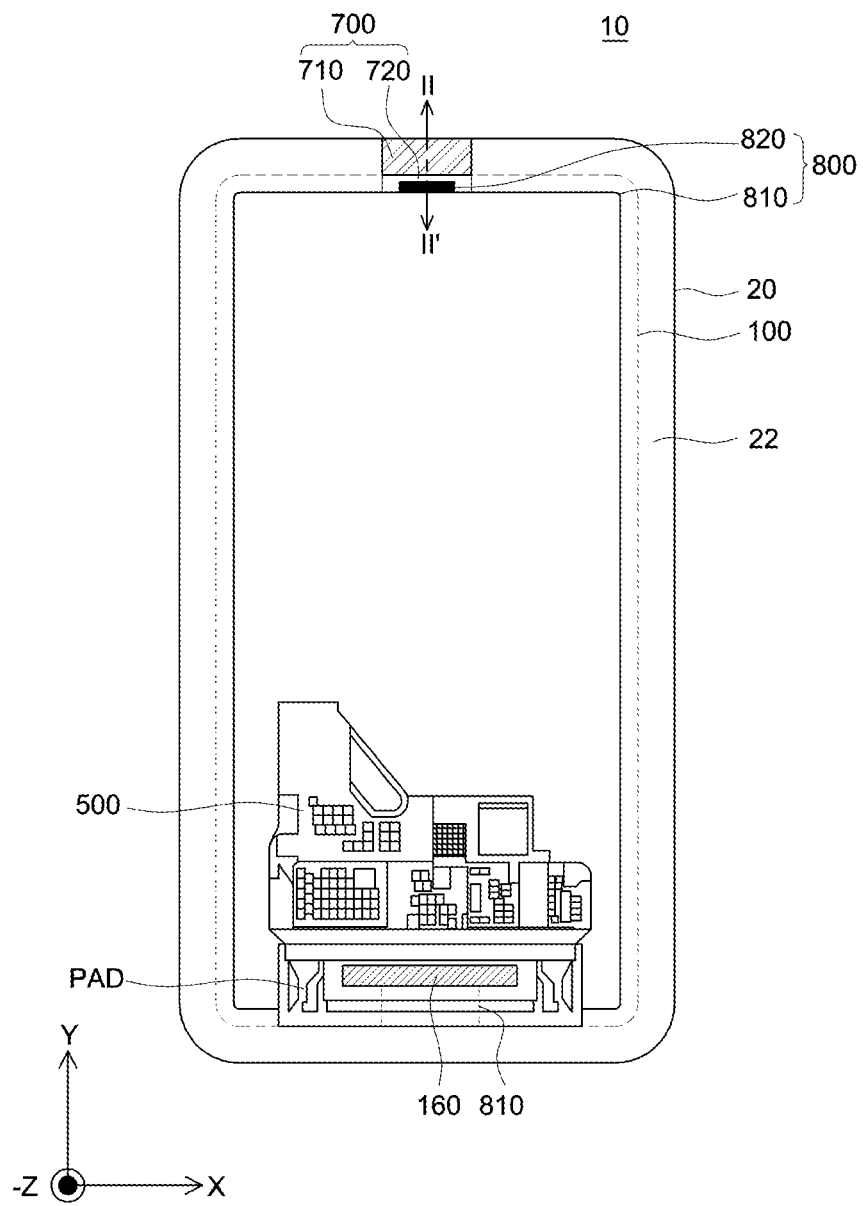
FIG. 1B is a plan view of a rear surface of a display apparatus according to an exemplary embodiment of the present disclosure.

FIG. 1A is a plan view of a front surface of a display apparatus according to an exemplary embodiment of the present disclosure, and FIG. 1B is a plan view of a rear surface of a display apparatus according to an exemplary embodiment of the present disclosure.

Referring to FIGS. 1A and 1B, the display apparatus 10 may include a display panel 100 and a cover member 20 which is disposed on the display panel 100.

The display apparatus 10 may further include a first plate and a cushion plate disposed below a front surface portion FP of the display panel 100.

The display panel 100 includes a substrate, a pixel array part, and an encapsulation part, and may display an image.

The cover member 20 is disposed to cover the front surface of the display panel 100, and may protect the display panel 100 from the external impact. The cover member 20 may be formed of cover glass, tempered glass, and tempered plastic, but is not limited thereto.

An edge portion of the cover member 20 may have a curvature portion or a curved surface bent in the lower direction (−Z axis) of the display apparatus 10.

The cover member 20 may be disposed to cover up to a side area of the display apparatus 10 disposed on a rear surface to protect the display panel 100 from the external impact not only on the front surface but also on the side surface of the display apparatus 10.

The cover member 20 may be formed of a transparent material so as to overlap an area in which an image is displayed. For example, the cover member 20 may be formed of a cover glass of a transparent plastic material or a transparent glass material which transmits the image, but is not limited thereto.

The front surface portion FP of the display panel 100 may be disposed below the cover member 20. In the front surface portion FP, a pixel having a plurality of light emitting diodes and a driving thin film transistor, and a pixel array part including a signal line which transmits a driving signal are disposed to display an image. The front surface portion FP may include an active area AA in which an image is displayed and a non-active area NA which is an area other than the active area. The non-active area NA may be formed in a border area which encloses the active area AA.

The active area AA and the non-active area NA may be applied to the cover member 20 in the same way. In the cover member 20, an area in which the image is transmitted may be an active area AA, and an area which encloses the active area AA and does not transmit the image may be a non-active area NA. The non-active area NA may be a bezel area, but is not limited to the terminology.

The display panel 100 may be disposed below the cover member 20. The display panel 100 may include a bending portion and a pad part PAD. For example, the bending portion may extend from one side of the front surface portion PF to be bent. For example, the pad part PAD extends from the bending portion, and may be disposed below the front surface portion. In the pad part PAD, a driver 160 for driving the pixel is mounted, or a flexible circuit board 500 may be connected thereto.

FIG. 1B illustrates a rear surface of the display apparatus 10 to which the rear surface of the display panel 100, the pad part PAD, the driver 160, and the flexible circuit board 500 are connected. Further, a light shielding part 22 and an antistatic member 700 disposed on a lower surface of the cover member 20, and a crack detecting part 800 formed on the display panel 100 may be included.

The antistatic member 700 may be formed of a material having an electric conductivity to move charges or the electric field. The antistatic member 700 may be formed by naturally drying or photocuring the antistatic liquid, but the exemplary embodiment of the present disclosure is not limited thereto. The antistatic liquid may be formed of a solution including a conductive material having excellent electric conductivity, or also formed of a conductive polymer compound, but the exemplary embodiment of the present disclosure is not limited thereto.

The antistatic member 700 may include a first antistatic part 710 and a second antistatic part 720. The first antistatic part 710 may be disposed below the cover member 20 and/or on a side surface of the display panel 100. The second antistatic part 720 may be disposed at a hole which passes through a part of components of the display panel 100. The first antistatic part 710 and the second antistatic part 720 may be connected to be in contact with each other, and move charges or electric field generated in the cover member 20 or the display panel 100 to the crack detecting part 800.

The crack detecting part 800 may be disposed along a periphery of the display panel 100, and include a crack detecting line 810 and a crack detection extending part 820.

The crack detecting line 810 is disposed along the periphery of the display panel 100, and may detect a crack generated in an edge area of the display panel 100. The crack detection extending part 820 protrudes from a partial area of the crack detecting line 810 to have a larger width than the crack detecting line 810, and may be connected to the antistatic member 700.

The crack detection extending part 820 may also detect a crack generated in the display panel 100, and the crack detection extending part 820 may be also formed in the entire area of the crack detecting line 810, rather than in a part of the crack detecting line 810.

One end of the crack detecting part 800 is connected to the driver 160 mounted in the pad part PAD of the display panel 100 to be applied with a sensing signal. The sensing signal is input to one end of the crack detecting part 800, and the input sensing signal is output to the driver 160 via the crack detecting part 800. The other end of the crack detecting part 800 is connected to the driver 160 to output a result detected by the crack detecting part 800 to the driver 160. The driver 160 compares a sensing signal input to one end of the crack detecting part 800 and a sensing signal output from the other end of the crack detecting part 800 to detect the crack or the penetration of moisture.

For example, the driver 160 may include a logic circuit which compares a voltage of the input sensing signal and a voltage of the output sensing signal to measure a resistance of the crack detecting part 800, and sense the crack or the penetration of the moisture from the change in the resistance.

Alternatively, the sensing driver applies the sensing signal to the crack detecting part 800 to maintain a constant voltage. When the resistance of the crack detecting part 800 increases due to the crack or the moisture penetration, the sensing driver increases a voltage to be applied to maintain the constant voltage, and may sense a change in the voltage to be applied to sense the crack. However, the crack sensing method is not limited thereto.

The crack detecting part 800 is connected to the antistatic member 700, and may move the charges or the electric field generated in the cover member 20 or the display panel 100 to the crack detecting part 800. The antistatic member 700 is formed in a part of an edge of the cover member 20, or may be formed in the entire edge area.

One end and the other end of the crack detecting part 800 are connected to the driver 160, and the driver 160 has a ground pattern formed therein, or may be connected to a ground portion formed in a product or a circuit board. Accordingly, the charges or the electric field which move through the crack detecting part 800 may be grounded by the driver 160. When the antistatic member 700 is electrically connected to the ground part through a ground path, the charges of the cover member 20 or the display panel 100 may be grounded to be removed.

In order to contact and connect the crack detecting part 800 and the antistatic member 700, the crack detecting part 800 and the antistatic member 700 may have larger widths than the line width to be in stable contact with each other so that a contact resistance may be lowered. Accordingly, a partial area of the crack detecting part 800 which is in contact with the antistatic member 700 may be formed to protrude. The crack detecting part 800 may include a crack detecting line 810 and a crack detection extending part 820 having a larger width than the crack detecting line 810, and the antistatic member 700 may contact and connect the crack detection extending part 820.

In order to form the antistatic member 700, an antistatic liquid may be applied on the cover member 20, a side surface of the display panel 100, and an end portion of the first plate 210 or a cushion plate 300 using a dispenser.

The antistatic liquid may be applied in a predetermined area or the entire border area of the display apparatus 10 by a dotting method while moving. At the corner of the display apparatus 10, it may be difficult to apply a constant amount of antistatic liquid so that the application of the antistatic liquid on the corner may be omitted. The antistatic liquid is naturally dried or photocured to form the antistatic member 700.

Figure 2:
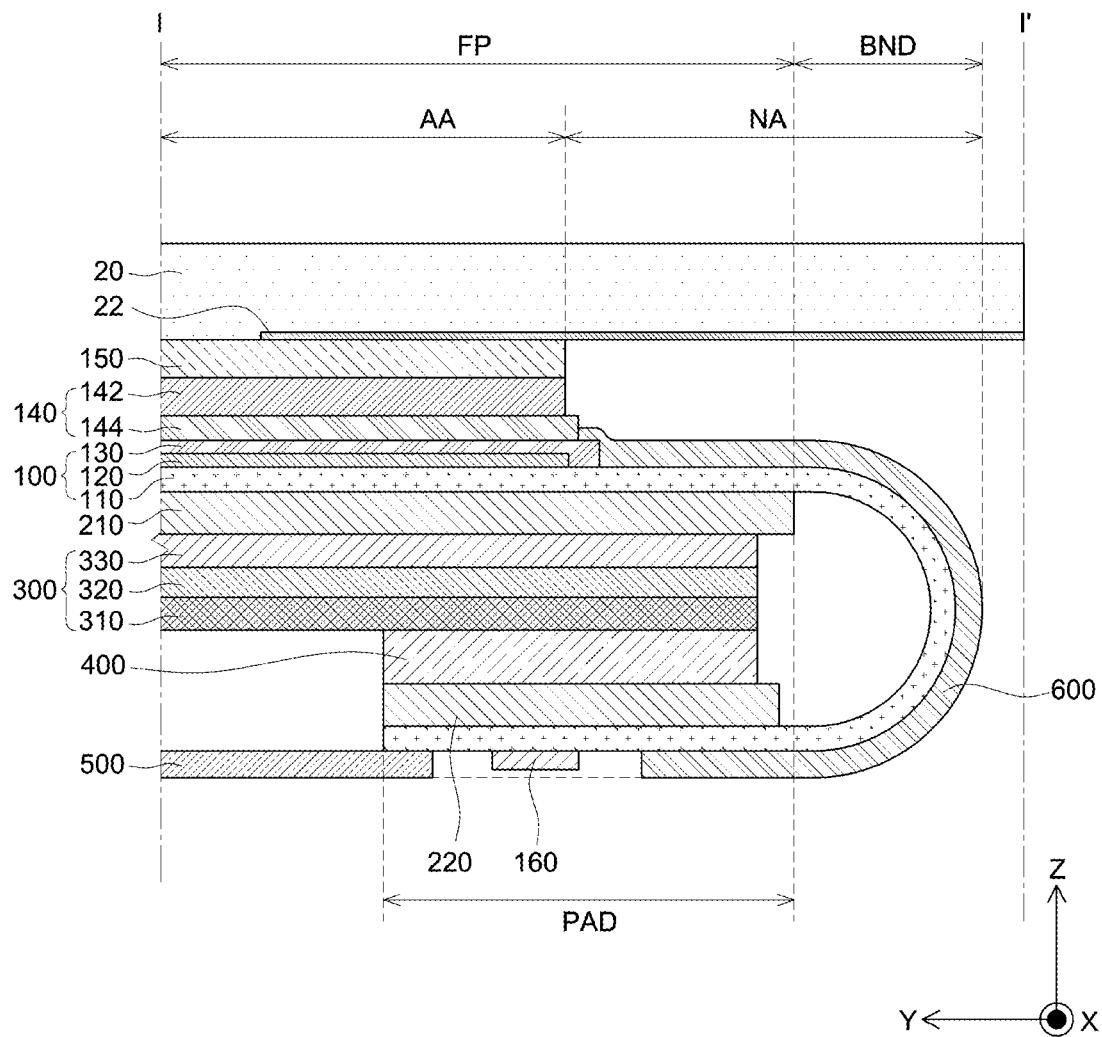
FIG. 2 is a cross-sectional view taken along the line I-I' of FIG. 1A.

FIG. 2 is a cross-sectional view taken along the line I-I' of FIG. 1A.

Referring to FIG. 2, the display apparatus 10 may include a cover member 20 located at the top and a display panel 100 disposed below the cover member 20.

An optical plate 140 having a first hole may be disposed between the display panel 100 and the cover member 20.

A first connection member 150 may be disposed between the cover member 20 and the optical plate 140. The first connection member 150 may connect or couple the cover member 20 and the optical plate 140.

The first connection member 150 may overlap the active area AA so that a material through which an image of the display panel 100 is transmitted may be used. For example, the first connection member 150 may be formed of a material such as an optical clear adhesive (OCA), an optical clear resin (OCR), or a pressure sensitive adhesive (PSA), or a material including the same, but is not limited thereto.

A light shielding part 22 may be disposed in a border area including a non-active area NA on a lower surface of the cover member 20.

The light shielding part 22 may block various circuits, wiring lines, and various structures disposed in the non-active area NA of the display panel 100, from being visible to the user.

The light shielding part 22 may be disposed so as to correspond to at least the non-active area NA of the display panel 100. The light shielding part 22 may be formed of a material which may absorb light.

For example, the light shielding part 22 may be formed of a black matrix, and may be also formed by a method for printing a black ink, but is not limited thereto.

The light shielding part 22 may be formed to include a conductive material. The conductive material may also be formed of molybdenum (Mo), chrome (Cr), titanium (Ti), nickel (Ni), neodymium (Nd), copper (Cu), and an alloy of silver (Ag) and magnesium (Mg), but is not limited thereto.

When the light shielding part 22 includes a conductive material, the first antistatic part 710 disposed below the cover member 20 may be omitted. Alternatively, a material which absorbs light may be included in the first antistatic part 710 so that the light shielding part 22 may be also omitted.

The display panel 100 disposed below the cover member 20 may include a front surface portion FP, a bending portion BND, and a pad part PAD with respect to a display substrate 110.

The front surface portion FP of the display panel 100 may be disposed below the first connection member 150. For example, the front surface portion FP may be a portion in which the image is displayed, and include a display substrate 110, a pixel array part 120, an encapsulation part 130, and an optical plate 140.

The bending portion BND of the display panel 100 is a portion which extends from one side of the front surface portion FP to be bent toward the lower direction (−Z axis) and then bent in the plane (Y-axis) direction. The bending portion BND may include the display substrate 110 and a signal line.

The pad portion PAD of the display panel 100 extends from the bending portion BND to be disposed below the front surface portion FP. The pad part PAD may include the display substrate 110, the signal line, and a pad electrode connected to the signal line. In the pad electrode, a driver 160 for driving a pixel or a flexible circuit substrate 500 may be mounted.

The optical plate 140 may be disposed above the display panel 100. A functional layer for improving a display performance of the display apparatus 10 may be further disposed between the first connection member 150 and the optical plate 140.

The optical plate 140 may suppress the reflection of external light to improve outdoor visibility and a contrast ratio for an image which is displayed on the display panel 100.

The optical plate 140 may include an optical film 142 and a first adhesive layer 144. The optical film 142 may include a polarizer. The polarizer is formed by stretching polyvinyl alcohol (PVA) dyed with iodine or dichroic dye, and an absorption axis is formed in the stretching direction. Light which vibrates in a direction parallel to the absorption axis is absorbed and light which vibrates in a direction perpendicular to the absorption axis may be selectively transmitted, by the polarizer.

The optical film 142 may include first and second protective films formed of a material such as tri-acetyl cellulose (TAC) or acryl, on both surfaces of the polarizer, to suppress the contraction of the polarizer.

The optical film 142 may include a retarder. The retarder may be a quarter wavelength film (QWP) or a half wavelength film (HWP). The retarder may be formed by stretching a cyclo-olefin polymer or cyclic olefin polymer (COP) film.

A first adhesive layer 144 of the optical film 142 may serve to bond the optical film 142 onto the display panel 100.

The display substrate 110 may be disposed on the bottom of the display panel 100. All the front surface portion FP, the bending portion BND, and the pad part PAD may have the display substrate 110. The display substrate 110 is formed of a plastic material having flexibility to be flexible. The display substrate 110 may be formed to include polyimide, and also formed of a thin glass material having a flexibility, but is not limited thereto.

The pixel array part 120 may be disposed on the display substrate 110. The pixel array part 120 may generate an image, and a portion in which the pixel array part 120 is disposed may be an active area AA. Accordingly, an area corresponding to the pixel array part 120 with respect to the cover member 20 is an active area AA, and an area other than the active area AA may be a non-active area NA.

The pixel array part 120 may include a light emitting diode, a driving thin film transistor for driving the light emitting diode, and signal lines such as a gate line, a data line, and a pixel driving power line on the display substrate 110.

The pixel array part 120 may include a pixel which displays an image according to a signal supplied to the signal lines, and the pixel may include a light emitting diode and a driving thin film transistor. The light emitting diode may include an anode electrode connected to a driving thin film transistor, a light emitting layer formed on the anode electrode, and a cathode electrode which supplies a common voltage.

The driving thin film transistor may include a gate electrode, a semiconductor layer, a source electrode, and a drain electrode. The semiconductor layer of the driving thin film transistor may include silicon such as a-Si, poly-Si, or low temperature poly-Si, or oxide such as indium gallium zinc oxide (IGZO), but is not limited thereto.

The anode electrode is disposed so as to corresponding to an opening area provided according to a pattern shape of the pixel, in each pixel area, to be electrically connected to the driving thin film transistor.

The light emitting diode may include the light emitting layer formed between the anode electrode and the cathode electrode. The light emitting layer may be implemented to emit same color light for each pixel, such as white light, or implemented to emit different color light for each pixel, such as red, green, or blue light.

The encapsulation part 130 may be disposed on the display substrate 110 so as to cover the pixel array part 120. The encapsulation part 130 may suppress oxygen, moisture, or foreign materials from penetrating into the light emitting diode layer of the pixel array part 120. The encapsulation layer 130 may be formed with a double layered structure in which an organic material layer and an inorganic material layer are alternately laminated, but is not limited thereto.

The front surface portion FP of the display panel 100 includes the display substrate 110, the pixel array part 120, and the encapsulation part 130, and may be formed in a flat state excepting the border portion. A first plate 210 may be connected or coupled to the front surface portion FP to maintain a flat state and enhance the rigidity.

The bending part BND of the display panel 100 is a portion which is easily bent in a direction desired by the user and may be formed to include the display substrate 110 and the signal lines on which the pixel array part 120, the encapsulation part 130, and the first plate 210 are not disposed.

The pad part PAD of the display panel 100 may be a portion in which the pixel array part 120 and the encapsulation part 130 are not disposed. The pad part PAD may be connected or coupled to a second plate 220 to maintain a flat state and enhance the rigidity.

With respect to the shape of the display panel 100 before being bent, the first plate 210 disposed below the front surface portion FP of the display panel 100 and the second plate 220 disposed below the pad part PAD are coupled to the lower portion of the display substrate 110. By doing this, the first plate 210 and the second plate 220 may maintain the flat state of the front surface portion FP and the pad part PAD while supplementing the rigidity of the display substrate 110.

The first plate 210 and the second plate 220 may be formed to have a predetermined strength and thickness to supplement the rigidity of the display substrate 110, and may be not formed in the bending portion BND area in which the bending portion BND is located.

With respect to the shape of the display panel 100 before being bent, the first plate 210 and the second plate 220 are disposed below the display substrate 110, and may be disposed to be spaced apart from each other.

With respect to a shape of the display panel 100 after being bent, the first plate 210 is disposed below the front surface portion FP and the second plate 220 is disposed above the pad part PAD.

The first plate 210 and the second plate 220 may be backplates which are disposed on the rear surface of the display substrate 110. The first plate 210 and the second plate 220 may be formed of plastic thin films having rigidity. For example, the first plate 210 and the second plate 220 may be configured by polyethylene terephthalate (PET), polyimide (PI), polyethylene naphthalate (PEN), but are not limited thereto. The first plate 210 and the second plate 220 may be formed of the same material with the same thickness, but are not limited thereto.

With respect to the shape of the display panel 100 after being bent, a cushion plate 300 may be disposed between the first plate 210 and the second plate 220. The cushion plate 300 may be a plurality of layers or a single layer including a cushion function and a heat dissipating function, but is not limited to the terminology.

The cushion plate 300 may include one or more of a heat dissipating layer 310, a cushion layer 320, and a second adhesive layer 330. For example, the cushion plate 300 may have a form in which a second adhesive layer 330, the cushion layer 320, and the heat dissipating layer 310 are laminated from the top to the bottom (−Z axis).

The heat dissipating layer 310 may be disposed to correspond to a component which generates a high temperature, and may include a material having a high thermal conductivity. Heat generated in the driver 160 or the display panel 100 may be dissipated by the heat dissipating layer 310.

For example, the heat dissipating layer 310 may include a metal having a high thermal conductivity, such as copper (Cu) and aluminum (Al), or graphite, but is not limited thereto. Further, the heat dissipating layer 310 has a conductivity to have a grounding function and a function of protecting the rear surface of the display substrate 110 as well as the heat dissipating function.

An anti-lifting layer may be additionally disposed between the heat dissipating layer 310 and the cushion layer 320. The anti-lifting layer is formed of a material having a flexibility such as a polyimide film to be disposed to suppress the lifting phenomenon of the cushion plate 300 which may be caused by bending the side surface of the cover member 20.

The cushion layer 320 is disposed on the heat dissipating layer 310, and may include a material having a cushion, such as a foam tape or a foam pad. The cushion layer 320 may alleviate impacts of various components to be in contact with the cushion plate 300.

The cushion layer 320 having an impact alleviating function may reinforce the rigidity of the cushion plate 300.

The second adhesive layer 330 is disposed on the cushion layer 320, and may include an uneven structure formed on the surface of the second adhesive layer 330. When the cushion plate 330 is attached to the first plate 210, the uneven structure of the second adhesive layer 330 may suppress bubbles generated between the first plate 210 and the cushion plate 300. Accordingly, a deformation process for removing the bubbles between the first plate 210 and the cushion plate 300 may be omitted.

The second adhesive layer 330 includes an adhesive component, and is in direct contact with the first plate 210 to fix the cushion plate 300 to the first plate 210.

The second connection member 400 and the second plate 220 may be disposed below the cushion plate 300.

The second connection member 400 may be disposed between the cushion plate 300 and the pad part PAD or the second plate 220. The second connection member 400 may serve to fix the bent display panel 100 to maintain a bending form. The second connection member 400 may be formed to have a predetermined thickness in a thickness direction to maintain a constant curvature of the bending portion BND. The second connection member 400 may be a double-sided tape having an adhesiveness to fix the second plate 220 and the heat dissipating layer 310 of the cushion plate 300, but is not limited thereto. The second connection member 400 is formed of a foam tape or a foam pad having an adhesiveness to have an effect of alleviating an impact.

The second plate 220 may be disposed below the second connection member 400. In order to dispose and fix the second plate 220 to the lower portion of the second connection member 400, the second plate 220 is connected or attached to a lower surface of the pad part PAD of the display panel 100. The bending portion BND is bent to attach or fix the second plate 220 to the lower surface of the second connection member 400.

A reinforcement member 600 may be disposed on an upper surface which is an outer portion of the bending portion BND of the display panel 100. The reinforcement member 600 covers the bending portion BND, and may extend to cover at least a partial area of the front surface portion FP and the pad portion PAD.

The reinforcement member 600 may include resin. For example, the reinforcement member 600 may include an ultraviolet (UV) photocurable acrylic resin or a thermosetting resin. Various materials may be used for the reinforcement member 600, but are not limited to the material described in the specification.

The reinforcement member 600 may be formed of a photocured resin that has undergone a photocuring process after applying the resin. When the ultraviolet (UV) photocurable resin is used, the resin may be photocured by irradiating ultraviolet (UV) light. The reinforcement member 600 may be a micro cover layer (MCL), but is not limited to the terminology.

The reinforcement member 600 may cover various signal lines disposed between the encapsulation part 130 and the pad part PAD of the display panel 100 to suppress the penetration of the moisture into the signal line while protecting the signal line from the external impact.

In order to increase the flexibility of the display panel 100, some of components other than the display substrate 110 and the signal line is removed from the bending portion BND so that the rigidity is lowered, and the reinforcement member 600 may supplement the rigidity of the bending portion BND in which the other components are removed.

The bending portion BND is disposed between the front surface portion FP and the pad part PAD, and connects the front surface portion FP and the pad part PAD, and may be bent to dispose the pad part PAD below the front surface portion FP.

Figure 3:
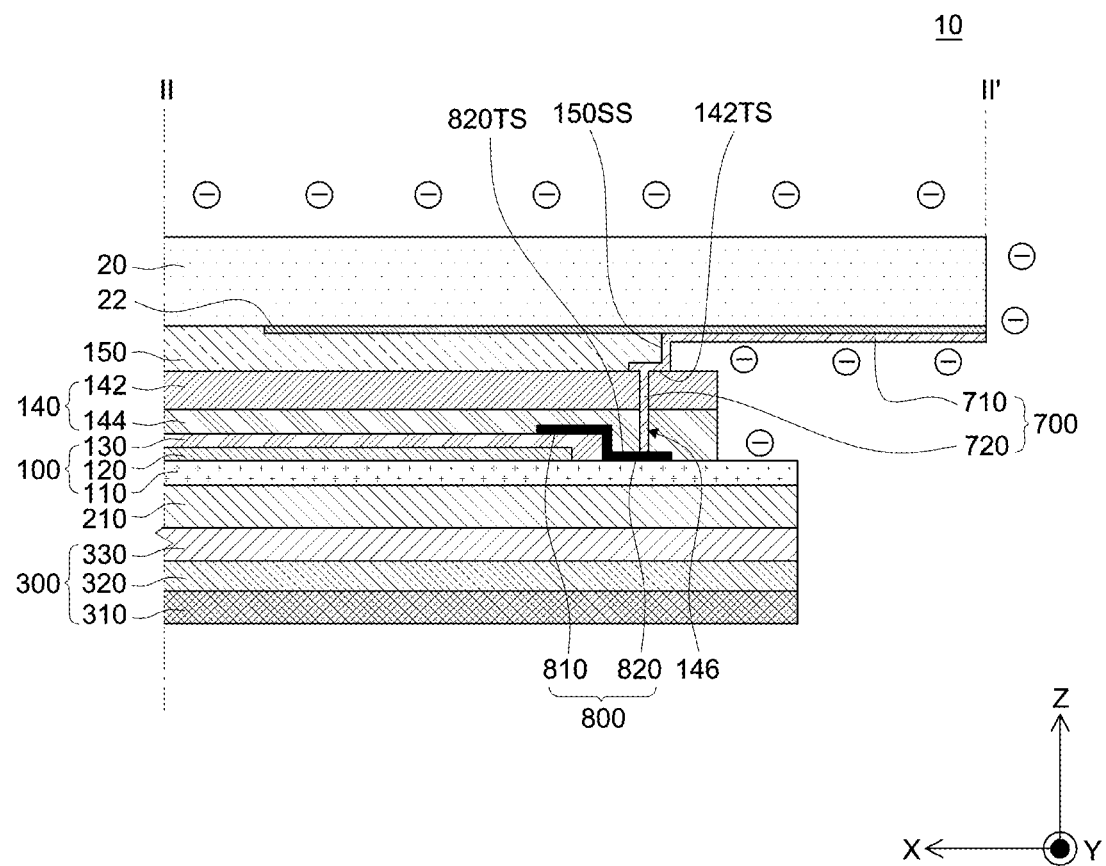
FIG. 3 is an example of a cross-sectional view taken along the line II-II' of FIG. 1B.

FIG. 3 is an example of a cross-sectional view taken along the line II-II' of FIG. 1B, and a drawing illustrating an exemplary embodiment of the present disclosure.

In FIG. 1B, even though it is illustrated that the antistatic member 700 is formed at an upper portion of the display apparatus 10, the antistatic member 700 may be formed in a plurality of areas of the display apparatus 10, and may be formed in the entire border area of the display apparatus 10.

Referring to FIG. 3, the display panel 100 which displays the image may include the display substrate 110, the pixel array part 120, and the encapsulation part 130. The cover member 20 which protects the display panel 100 from the external impact may be disposed on the display panel 100. The optical plate 140 having a first hole 146 may be disposed between the display panel 100 and the cover member 20.

The antistatic member 700 for moving charges or the electric field generated in the cover member 20 and/or the display panel 100 may be disposed in the lower portion of the cover member 20 and the first hole 146, and may be disposed to be in contact with the crack detecting part 800. Specifically, the antistatic member 700 may include a first antistatic part 710 disposed below the cover member 20, and a second antistatic part 720 disposed at the first hole 146 of the optical plate 140.

The first antistatic part 710 is disposed on the lower surface of the cover member 20, or may be disposed on a lower surface of the light shielding part 22 of the cover member 20. In the case of a structure in which the light shielding layer is omitted to dispose the first antistatic part 710 on the lower surface of the cover member 210, in order to allow the first antistatic part 710 to have a function of the light shielding part as well, a black matrix or black ink may be mixed to the first antistatic part 710. However, it is not limited thereto.

The first antistatic part 710 may be formed to include a conductive material having an excellent electric conductivity, or also formed of a conductive polymer compound. The conductive material may be formed to include molybdenum (Mo), chrome (Cr), titanium (Ti), nickel (Ni), neodymium (Nd), copper (Cu), and an alloy of silver (Ag) and magnesium (Mg), and the conductive polymer compound may be poly(3,4-ethylenedioxythiophene) polystyrene sulfonate (PEDOT:PSS). However, it is not limited thereto.

The first antistatic part 710 may be also continuously disposed in a partial area of the side surface and the rear surface of the first connection member 150 disposed between the cover member 20 and the display panel 100.

The first antistatic part 710 continuously applies and naturally dries or photocures the conductive material or a conductive antistatic liquid from the lower surface of the cover member 20 to the lower surface of the first connection member 150 to be continuously disposed on the side surface and the rear surface of the first connection member 150.

The first connection member 150 and the cover member 20 having the first antistatic part 710 are attached or connected to the display panel 100 to which the optical plate 140 is connected to connect the first antistatic part 710 and the second antistatic part 720.

The crack detecting part 800 is disposed on the encapsulation part 130 to detect a crack generated in the display panel 100. The encapsulation part 130 suppresses the penetration of the foreign material, such as oxygen or moisture, into the pixel array part 120. When the crack is generated in the encapsulation part 130, oxygen or moisture penetrates into the pixel array part 120 which may be easily damaged. Accordingly, in order to detect the crack of the encapsulation part 130, the crack detecting part 800 may be disposed on the upper surface of the encapsulation part 130 or to be adjacent to the encapsulation part 130. The crack detecting part 800 may be disposed in the encapsulation part 130. The encapsulation part 130 is configured by a first inorganic layer, an organic layer, and a second inorganic layer, and the crack detecting part 800 may be disposed between the organic layer and the second inorganic layer.

The second antistatic part 720 connected to the crack detecting part 800 forms the first hole 146 in the optical plate 140 to be connected to the crack detecting part 800 disposed below the optical plate 140, and the second antistatic part 720 may be disposed at the first hole 146.

The first antistatic part 710 and the second antistatic part 720 are connected, and the second antistatic part 720 and the crack detecting part 800 are connected to move charges generated in the cover member 20 to the crack detecting part 800 through the first antistatic part 710 and the second antistatic part 720.

The second antistatic part 720 may be formed by forming the first hole 146 in the optical plate 140 in an area in which the crack detecting part 800 is located, and filling the first hole 146 with the antistatic liquid to naturally dry or photocure.

In order to easily bring the antistatic member 700 and the crack detecting part 800 to be in contact with each other, the crack detecting part 800 may form a crack detection extending part 820. The crack detecting part 800 may be formed to include the crack detecting line 810 and the crack detection extending part 820 which protrudes from a partial area of the crack detecting line 810 to have a width larger than the crack detecting line 810. The antistatic member 700 may be in contact with the crack detection extending part 820 having a larger width to be grounded.

For example, when the crack detecting line 810 is formed with a width of 10 μm or smaller, and the second antistatic part 720 is formed with a width of 30 μm or larger, the crack detecting line 810 and the second antistatic part 720 are in contact with in a small area of 10 μm or smaller so that the contact resistance may increase. Further, it may be difficult to be positioned to connect the crack detecting line 810 and the second antistatic part 720.

Accordingly, a partial area of the crack detecting line 810 protrudes to form the crack detection extending part 820 to be equal to or larger than the width of the second antistatic part 720 of 30 μm so that the second antistatic part 720 and the crack detection extending part 820 may be brought in contact with each other.

The antistatic member 700 and the crack detecting part 800 move the charges or the electric field generated in the cover member 20 or the display panel 100 to the driver 160 to be grounded or discharged to the outside.

When the corner portion of the first connection member 150 is formed to be angulated, the first antistatic part 710 may be disconnected at the corner portion of the first connection member 150.

The first connection member 150 is partially removed from a position in which the crack detection extending part 820 is disposed to have a concave shape so that the first antistatic part 710 is not disposed at the corner portion of the first connection member 150, but is connected to the second antistatic part 720. That is, a partial area of the first connection member 150 may have a concave shape.

When a partial area of the first connection member 150 is removed so that the end of the first connection member 150 and a placement position of the second antistatic part 720 match, the first antistatic part 710 is not disposed at the corner portion of the first connection member 150, but may be connected to the second antistatic part 720.

A thickness of the antistatic member 700 may be 1 μm to 10 μm. When the thickness of the antistatic member 700 is 1 μm or less, the electric conductivity of the conductive compound is significantly reduced so that the antistatic member 700 may not smoothly discharge the charges. When the thickness of the antistatic member 700 is 10 μm or more, the contact with the ground part or the ground pattern may be interrupted due to the thickness of the antistatic member 700.

According to one embodiment, the optical film 142 has a top surface 142TS and the first connection member 150 has a side surface 150SS as shown in FIG. 3. The antistatic member 700 may extend from the cover member 20 and contact the side surface 150SS of the first connection member 150. The antistatic member 700 may further extend to contact the top surface 142TS of the optical film 142 and extend through the first hole 146 to contact a top surface 820TS of the crack detection extending part 820.

In some embodiments, the first antistatic part 710 and the second antistatic part 720 may be continuous and contiguous to each other.

In some embodiments, the crack detection extending part 820 and the crack detecting line 810 are continuous and contiguous to each other and both parts are disposed on different layers of the display panel 100. For instance, as shown in FIG. 3, the crack detection extending part 820 is on the display substrate 110 and the crack detecting line 810 is on the encapsulation part 130.

Figure 4:
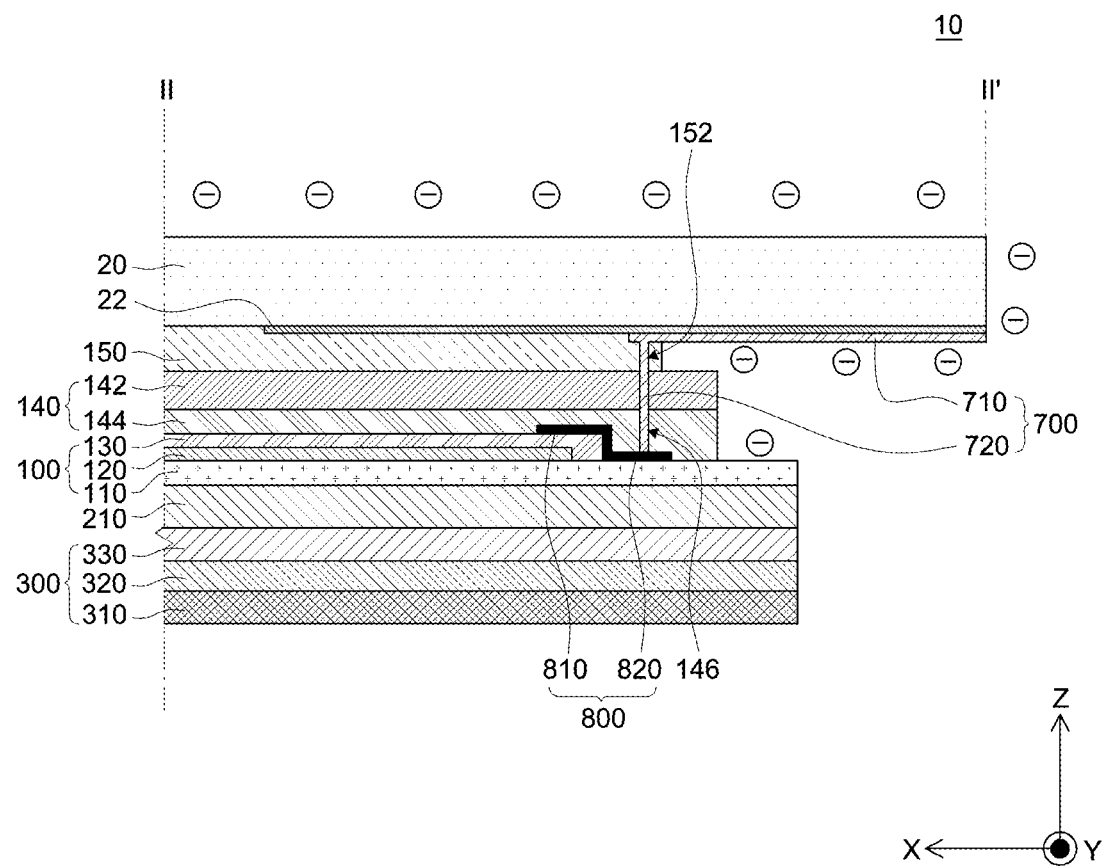
FIG. 4 is another example of a cross-sectional view taken along the line II-II' of FIG. 1B.

FIG. 4 is another example of a cross-sectional view taken along the line II-II' of FIG. 1B, and illustrates another exemplary embodiment of the present disclosure.

Referring to FIG. 4, the antistatic member 700 may be disposed below the cover member 20, in the optical plate 140, and the display panel 100 to be connected to the crack detecting part 800. The antistatic member 700 may include a first antistatic part 710 and a second antistatic part 720. The first antistatic part 710 may be disposed below the cover member 20, and the second antistatic part 720 is disposed at a hole which passes through the first connection member 150 and the optical plate 140 to be in contact with the first antistatic part 710 and the crack detecting part 800.

The first antistatic part 710 and the second antistatic part 720 are separately formed to be in contact with each other.

For example, the first antistatic part 710 may be formed by applying and naturally drying or photocuring the antistatic liquid on a lower surface of the light shielding part 22 of the cover member 20 or a lower surface of the cover member 20. The first antistatic part 710 may include a conductive material and/or light shielding material, and have a conducting function and a light shielding function. The first antistatic part 710 is disposed to a position overlapping the crack detecting part 800 to be in contact with the crack detecting part 800 through the second antistatic part 720.

The first antistatic part 710 may be formed by applying and naturally drying or photocuring the conductive material or the conductive antistatic liquid below the cover member 20.

The first antistatic part 710 is formed on the lower surface of the cover member 20, or may be formed on a lower surface of the light shielding part 22.

The second antistatic part 720 may be formed separately from the first antistatic part 710. A first hole 146 is formed in the optical plate 140 and a second hole 152 is formed in the first connection member 150 to allow the second antistatic part 720 to be in contact with the crack detecting part 800 disposed below the first connection member 150 and the optical plate 140. By doing this, the second antistatic part 720 may be disposed at the first hole 146 and the second hole 152.

The second antistatic part 720 may be formed by filling, with the antistatic liquid, the first hole 146 and the second hole 152 formed in an area overlapping an area in which the crack detecting part 800 is located, and naturally drying or photocuring the antistatic liquid.

The first antistatic part 710 is disposed below the cover member 20, and the second antistatic part 720 is disposed at the first hole 146 and the second hole 152 which pass through the optical plate 140 disposed on the display panel 100 and the first connection member 150. The cover member 20 on which the first antistatic part 710 is disposed and the display panel 100 on which the second antistatic part 720 is formed are attached or connected to connect the first antistatic part 710 and the second antistatic part 720.

The charges or the electric field generated in the cover member 20 may be grounded through the first antistatic part 710, the second antistatic part 720, and the crack detecting part 800.

In the exemplary embodiment of the present disclosure, the antistatic member 700 is not disposed on the side surface or the corner portion of the first connection member 150 and the optical plate 140 so that the manufacturing process may be simplified. Further, a disconnection phenomenon which may be caused when the antistatic member 700 is disposed on the side surface or the corner portion may be improved.

Figure 5:
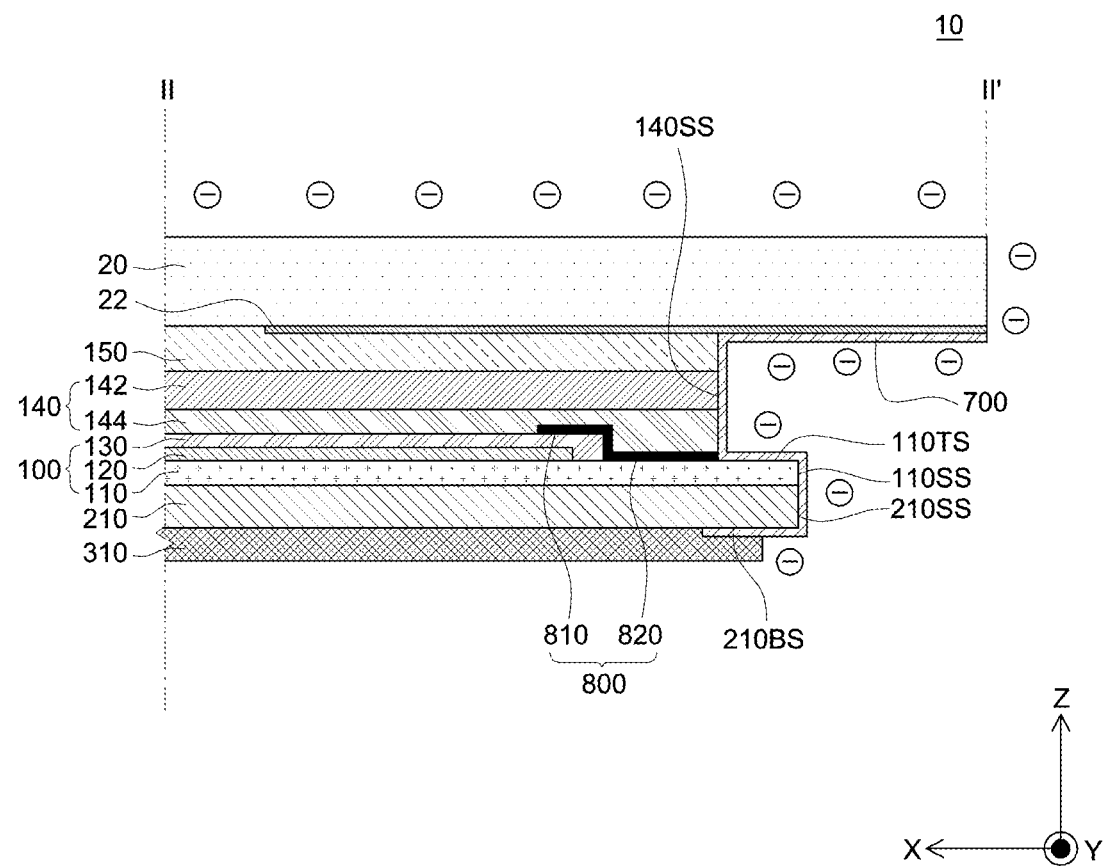
FIG. 5 is another example of a cross-sectional view taken along the line II-II' of FIG. 1B.

FIG. 5 is another example of a cross-sectional view taken along the line II-II' of FIG. 1B, and illustrates yet another exemplary embodiment of the present disclosure.

Referring to FIG. 5, the crack detecting part 800 which detects a crack generated in the display panel 100 may be disposed on the encapsulation part 130 of the display panel 100.

The crack detecting part 800 may include the crack detecting line 810 and the crack detection extending part 820 which protrudes from a partial area of the crack detecting line 810 to have a width larger than the crack detecting line 810.

The antistatic member 700 which is in contact with the crack detecting part 800 may be disposed at the end of the crack detecting part 800.

The antistatic member 700 may be continuously disposed below the cover member 20, a side surface of the first connection member 150, a side surface of the optical plate 140, and a side surface of the display panel 100. The end of the crack detection extending part 820 of the crack detecting part 800 extends to the end of the display panel 100 to be exposed. The exposed crack detection extending part 820 and the antistatic member 700 are in contact with each other to be grounded.

One end and the other end of the crack detecting part 800 including the crack detection extending part 820 may be connected to the driver 160 to be grounded. The driver 160 has a ground pattern or is connected to the ground part to have the ground function.

When the crack detection extending part 820 extends to the end of the display panel 100 to be in contact with the antistatic member 700 on the side surface of the display panel 100, there is no need to form a hole in the first connection member 150 and/or the optical plate 140 so that the manufacturing process is simplified.

According to the exemplary embodiment of the present disclosure, a first plate 210 may be disposed below the display panel 100 to support the display panel 100, and a heat dissipating layer 310 which dissipates heat generated in the driver 160 and/or the display panel 100 may be disposed below the first plate 210.

According to another embodiment, the antistatic member 700 extends from the cover member 20 (in particular, the antistatic member 700 contacts and extends from the surface of the light shielding part 22) and covers a side surface 140SS of the optical plate 140. As shown in FIG. 5, the antistatic member 700 further extends from the side surface 140SS of the optical plate 140 and covers a portion of a top surface 110TS of the display substrate 110, a side surface 110SS of the display substrate 110, a side surface 210SS of the first plate 210, a portion of a bottom surface 210BS of the first plate 210. In particular, a portion of the antistatic member 700 extends between the heat dissipating layer 310 and the first plate 210. Here, the portion of the antistatic member 700 that extends between the heat dissipating layer 310 and the first plate 210 overlaps with the crack detection extending part 820 from a plan view.

The crack detection extending part 820 contacts the antistatic member 700 at the side surface 140SS of the optical plate 140.

The heat dissipating layer 310 may be formed to include metal having a high thermal conductivity and electric conductivity, such as copper (Cu) and aluminum (Al).

The heat dissipating layer 310 may be a heat dissipating layer 310 formed by omitting the cushion layer 320 and the second adhesive layer 330 from the cushion plate 300. Even though in FIG. 5 of the present specification, a structure in which only the heat dissipating layer 310 of the cushion plate 300 is disposed below the first plate 210 is disclosed, a structure in which the entire cushion plate 300 is disposed below the first plate 210 may be also applied. At this time, the same effect as the structure in which only the heat dissipating layer 310 is disposed may be achieved.

The antistatic member 700 may further extend to the side surface of the display panel 100, the side surface of the first plate 210, and the rear surface of the first plate 210, and the antistatic member 700 may be in contact with the heat dissipating layer 310 disposed below the first plate 210.

The heat dissipating layer 310 is configured by a metal layer having electric conductivity, and has a larger area than that of the crack detecting part 800 to distribute the charges or the electric field to be removed. Alternatively, the heat dissipating layer 310 is connected to the ground part to perform a grounding function.

When the antistatic member 700 is in contact with the heat dissipating layer 310, the charges or the electric field generated in the cover member 20 and the display panel 100 are moved and distributed to the heat dissipating layer 310 to be removed.

In the exemplary embodiment of the present disclosure, the antistatic member 700 may be in double contact with the crack detection extending part 820 and the heat dissipating layer 310, and the grounding or charge removing effect may be further improved.

When the cushion plate 300 including the cushion layer 320, the second adhesive layer 330, and the heat dissipating layer 310 is disposed below the first plate 210, the antistatic member 700 extends from the lower portion of the cover member 20 to be disposed on the side surface of the second adhesive layer 330, the side surface of the cushion layer 320, and the upper portion of the heat dissipating layer 310. By doing this, the crack detection extending part 820 and the heat dissipating layer 310 may be in contact with each other.

Figure 6:
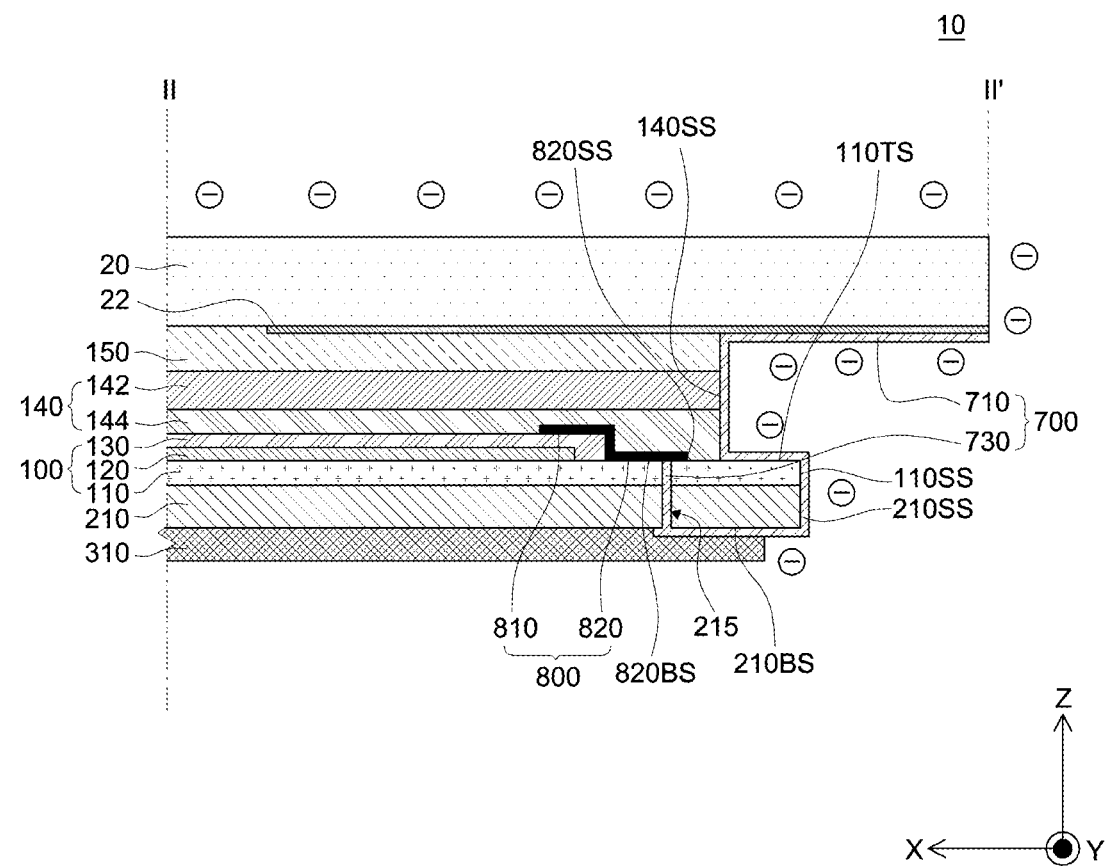
FIG. 6 is another example of a cross-sectional view taken along the line II-II' of FIG. 1B.

FIG. 6 is another example of a cross-sectional view taken along the line II-IP of FIG. 1B, and illustrates still another exemplary embodiment of the present disclosure.

Referring to FIG. 6, the antistatic member 700 detours the side surface area of the display panel 100 to be connected to the crack detecting part 800 through the lower portion of the display panel 100.

When a wiring line, such as a touch electrode, is disposed in an upper side surface area of the display panel 100, it may be difficult to form a hole in the first connection member 150 or the optical plate 140 to connect the antistatic member 700 and the crack detection extending part 820.

Further, in order to efficiently dispose a routing line to connect the touch electrode, when a material for the crack detecting part 800 is used to form a wiring line in a side surface area of the display panel 100, it may be difficult to extend the crack detection extending part 820 to the end of the display panel 100 to be connected to the antistatic member 700.

Accordingly, the antistatic member 700 may include a first antistatic part 710 which is disposed below the cover member 20, a side surface of the optical plate 140, a side surface of the display panel 100, and a side surface and a rear surface of the first plate 210 so as to detour the side area of the display panel 100.

The heat dissipating layer 310 is disposed below the first plate 210, and the first antistatic part 710 and the heat dissipating layer 310 are brought into contact with each other to move and distribute the charges or the electric field to the heat dissipating layer 310 to be removed.

A third hole 215 which passes through the first plate 210 and the display substrate 110 is formed in the first plate 210 and the display panel 100, and a third antistatic part 730 may be disposed at the third hole 215. The third antistatic part 730 is in contact with the crack detection extending part 820 of the crack detecting part 800 to be grounded.

The crack detecting part 800 may include the crack detecting line 810 and the crack detection extending part 820 which protrudes from a partial area of the crack detecting line 810 to have a width larger than the crack detecting line 810.

The first antistatic part 710 and the third antistatic part 730 are separately formed to be in contact with each other.

For example, the third hole 215 is formed in each of the display panel 100 and the first plate 210 to be connected to each other, and the third hole 215 is filled with the antistatic liquid to form the third antistatic part 730 which is in contact with the crack detecting part 800.

In a state in which the cover member 20, the display panel 100, and the first plate 210 are connected, the antistatic liquid is applied in the lower portion of the cover member 20, the side surface of the first connection member 150, the side surface of the optical plate 140, the side surface of the display panel 100, and the side surface and the rear surface of the first plate 210 to form the first antistatic part 710. The first antistatic part 710 is in contact with the third antistatic part 730.

The heat dissipating layer 310 is disposed on the rear surface of the first plate 210 to be in contact with the first antistatic part 710.

One end and the other end of the crack detecting part 800 are connected to the driver 160, and the driver 160 has a ground pattern formed therein or is connected to a ground portion to have a grounding function.

The antistatic member 700 is in double contact with the heat dissipating layer 310 and the crack detecting part 800 so that the grounding effect or the charge removing effect may be further improved.

Referring to FIG. 6, according to one embodiment, the antistatic member 700 extends from the cover member 20 (to be specific, the antistatic member 700 contacts and extends from the surface of the light shielding part 22) and covers a side surface 140SS of the optical plate 140. As shown, the antistatic member 700 further extends from the side surface 140SS of the optical plate 140 and covers a portion of a top surface 110TS of the display substrate 110, a side surface 110SS of the display substrate 110, a side surface 210SS of the first plate 210, a portion of a bottom surface 210BS of the first plate 210. In particular, a portion of the antistatic member 700 extends between the heat dissipating layer 310 and the first plate 210. Here, the portion of the antistatic member 700 that extends between the heat dissipating layer 310 and the first plate 210 further extends through the first plate 210 and the display substrate 110 and contacts a bottom surface 820BS of the crack detection extending part 820.

As shown, in the embodiment of FIG. 6, a side surface 820SS of the crack detection extending part 820 does not contact the antistatic member 700 at the side surface 140SS of the optical plate 140 and is spaced apart from each other. However, as described above, the antistatic member 700 surrounds the side surfaces 110SS and 210SS and the bottom surface 210BS and extends through the third hole 215 to contact the crack detection extending part 820 at its bottom surface 820BS.

The exemplary embodiments of the present disclosure can also be described as follows:

A display apparatus according to an embodiment of the present disclosure includes a display panel including a display substrate, a pixel array part, and an encapsulation part. The display apparatus further includes a cover member disposed on the display panel. The display apparatus further includes an optical plate which is disposed between the display panel and the cover member and has a first hole. The display apparatus further includes a crack detecting part disposed on the encapsulation part. The display apparatus further includes an antistatic member which is disposed below the cover member and in the first hole.

According to some embodiments of the present disclosure, the antistatic member may be in contact with the crack detecting part.

According to some embodiments of the present disclosure, the crack detecting part may include: a crack detecting line; and a crack detection extending part which protrudes from a partial area of the crack detecting line, and may have a width larger than the crack detecting line.

According to some embodiments of the present disclosure, the antistatic member may in contact with the crack detection extending part.

According to some embodiments of the present disclosure, the antistatic member may include: a first antistatic part disposed below the cover member; and a second antistatic part disposed at the first hole.

According to some embodiments of the present disclosure, the first antistatic part and the second antistatic part may be in contact with each other, and the second antistatic part and the crack detecting part may be in contact with each other.

According to some embodiments of the present disclosure, the display apparatus may further include a first connection member disposed between the cover member and the optical plate. The first antistatic part may be further disposed in one or more of a part of a side surface and a rear surface of the first connection member.

According to some embodiments of the present disclosure, a partial area of the first connection member may have a concave shape.

According to some embodiments of the present disclosure, the display apparatus may further include a first connection member disposed between the cover member and the optical plate and having a second hole. The second antistatic part may be further disposed at the second hole.

According to another aspect of the present disclosure, there is provided a display apparatus. The display apparatus includes a display panel including a substrate, a pixel array part, and an encapsulation part. The display apparatus further includes a cover member disposed on the display panel. The display apparatus further includes an optical plate disposed between the display panel and the cover member. The display apparatus further includes a first plate disposed below the display panel. The display apparatus further includes a crack detecting part disposed on the encapsulation part. The display apparatus further includes an antistatic member disposed on a side surface of the optical plate.

According to some embodiments of the present disclosure, the antistatic member may be in contact with the crack detecting part.

According to some embodiments of the present disclosure, the crack detecting part may include: a crack detecting line; and a crack detection extending part which protrudes from a partial area of the crack detecting line and has a width larger than the crack detecting line.

According to some embodiments of the present disclosure, the antistatic member may be in contact with the crack detection extending part.

According to some embodiments of the present disclosure, an end portion of the crack detection extending part may extend to an end of the display panel to be exposed, and the exposed crack detection extending part may be in contact with the antistatic member.

According to some embodiments of the present disclosure, the display apparatus may further include a heat dissipating layer disposed below the first plate. The antistatic member is further disposed between the first plate and the heat dissipating layer.

According to some embodiments of the present disclosure, the antistatic member may be in contact with the heat dissipating layer.

According to some embodiments of the present disclosure, the display apparatus further includes a third hole which passes through the first plate and the substrate. The antistatic member may include: a first antistatic part which is disposed below the cover member, on a side surface of the optical plate, on a side surface of the display panel, and on a side surface and a rear surface of the first plate; and a third antistatic part which is disposed at the third hole to be in contact with the crack detecting part.

According to some embodiments of the present disclosure, the display apparatus further includes a heat dissipating layer disposed below the first plate. The first antistatic part may be further disposed between the first plate and the heat dissipating layer.

According to some embodiments of the present disclosure, the first antistatic part may be in contact with the heat dissipating layer.

According to some embodiments of the present disclosure, the display apparatus further includes a driver connected to the crack detecting part. The driver may be connected to a ground part or has a grounding function.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:
a display panel including a substrate, a pixel array part, and an encapsulation part;
a cover member disposed on the display panel;
an optical plate disposed between the display panel and the cover member, the optical plate having a first hole;
a crack detecting part disposed on the encapsulation part and the substrate; and
an antistatic member disposed below the cover member and disposed at the first hole,
wherein the antistatic member extends through the optical plate and the extended antistatic member is in contact with the crack detecting part.

2. The display apparatus of claim 1, wherein the crack detecting part includes:
a crack detecting line; and
a crack detection extending part which protrudes from a partial area of the crack detecting line, and
wherein the crack detecting extending part has a width larger than the crack detecting line.

3. The display apparatus of claim 2, wherein the antistatic member is in contact with the crack detection extending part.

4. The display apparatus of claim 1, wherein the antistatic member includes:
a first antistatic part disposed below the cover member; and
a second antistatic part disposed at the first hole.

5. The display apparatus of claim 4, wherein the first antistatic part and the second antistatic part are in contact with each other, and the second antistatic part is in contact with the crack detecting part.

6. The display apparatus of claim 4, further comprising:
a first connection member disposed between the cover member and the optical plate,
wherein the first antistatic part is further disposed at one or more of a part of a side surface and a rear surface of the first connection member.

7. The display apparatus of claim 6, wherein a partial area of the first connection member has a concave shape.

8. The display apparatus of claim 4, further comprising:
a first connection member disposed between the cover member and the optical plate, the first connection member having a second hole,
wherein the second antistatic part is further disposed at the second hole.

9. A display apparatus, comprising:
a display panel including a display substrate, a pixel array part, and an encapsulation part;
a cover member disposed on the display panel;
an optical plate disposed between the display panel and the cover member;

a first plate disposed below the display panel;
a crack detecting part disposed on the encapsulation part; and
an antistatic member disposed at a side surface of the optical plate,
wherein the crack detecting part includes a crack detecting line and a crack detection extending part which protrudes from a partial area of the crack detecting line,
wherein an end portion of the crack detection extending part extends to an end portion of the display panel to be exposed, and
wherein the exposed crack detection extending part is in contact with the antistatic member.

10. The display apparatus of claim 9, wherein
crack detection extending part has a width larger than the crack detecting line.

11. The display apparatus of claim 10, wherein the antistatic member is in contact with the crack detection extending part.

12. The display apparatus of claim 10, further comprising:
a heat dissipating layer disposed below the first plate,
wherein the antistatic member is further disposed between the first plate and the heat dissipating layer.

13. The display apparatus of claim 12, wherein the antistatic member is in contact with the heat dissipating layer.

14. The display apparatus of claim 9, further comprising:
a driver electrically connected to the crack detecting part,
wherein the driver is electrically connected to a ground part or has a grounding function.

15. A display apparatus, comprising:
a display panel;
an optical plate on the display panel;
a cover member on the optical plate;
a crack detecting part; and
an antistatic member between the cover member and the display panel, the antistatic member having a first antistatic part and a second antistatic part continuous and contiguous to each other,
wherein the second antistatic part extends through the optical plate,
wherein the second antistatic part extends through the optical plate to connect to the crack detecting part.

16. The display apparatus of claim 15, comprising:
a light shielding part on the cover member,
wherein the first antistatic part contacts a surface of the light shielding part facing the optical plate.

17. The display apparatus of claim 15, wherein the display panel includes: a display substrate; a pixel array part on the display substrate; and an encapsulation part on the pixel array part, wherein the crack detecting part includes a crack detection extending part on the display substrate and a crack detecting line on the encapsulation part, and wherein the crack detection extending part and the crack detecting line are continuous and contiguous to each other and both parts are disposed on different layers of the display panel.

18. The display apparatus of claim 17, wherein the second antistatic part contacts the crack detection extending part of the crack detecting part.

19. A display apparatus, comprising:
a display panel including a display substrate, a pixel array part on the display substrate, and an encapsulation part on the pixel array part,
a hole extending through the display substrate;
an optical plate on the display panel;
a cover member on the optical plate;
a crack detecting part on the display panel; and
an antistatic member between the cover member and the display panel, the antistatic member extending from the cover member and covering a side surface of the optical plate,
wherein the antistatic member part covering the side surface of the display substrate further extends through the hole to contact the crack detection extending part.

20. The display apparatus of claim 19, wherein the antistatic member directly contacts the side surface of the optical plate.

21. The display apparatus of claim 19,
wherein the crack detecting part includes a crack detection extending part on the display substrate and a crack detecting line on the encapsulation part,
wherein the crack detection extending part and the crack detecting line are continuous and contiguous to each other and both parts are disposed on different layers of the display panel,
wherein the antistatic member extends to contact a side surface of the display substrate, and
wherein the antistatic member is spaced apart from the crack detection extending part at the side surface of the optical plate.

* * * * *

UNITED STATES PATENT AND TRADEMARK OFFICE
CERTIFICATE OF CORRECTION

| | | |
|---|---|---|
| PATENT NO. | : 12,339,547 B2 | Page 1 of 1 |
| APPLICATION NO. | : 18/186694 | |
| DATED | : June 24, 2025 | |
| INVENTOR(S) | : YeongHo Yun | |

It is certified that error appears in the above-identified patent and that said Letters Patent is hereby corrected as shown below:

In the Claims

<u>Column 21, Claim 10, Line 14:</u>
"wherein" should read: --wherein the--.

Signed and Sealed this
Sixteenth Day of September, 2025

Coke Morgan Stewart
*Acting Director of the United States Patent and Trademark Office*